(12) United States Patent
Tang et al.

(10) Patent No.: US 7,833,904 B2
(45) Date of Patent: Nov. 16, 2010

(54) METHODS FOR FABRICATING NANOSCALE ELECTRODES AND USES THEREOF

(75) Inventors: Jinyao Tang, New York, NY (US); Samuel J. Wind, White Plains, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 767 days.

(21) Appl. No.: 11/454,638

(22) Filed: Jun. 16, 2006

(65) Prior Publication Data

US 2007/0059645 A1    Mar. 15, 2007

Related U.S. Application Data

(60) Provisional application No. 60/691,197, filed on Jun. 16, 2005, provisional application No. 60/717,693, filed on Sep. 16, 2005, provisional application No. 60/718,777, filed on Sep. 20, 2005.

(51) Int. Cl.
*H01L 21/441* (2006.01)
(52) U.S. Cl. ............... 438/669; 438/584; 977/890; 257/E21.036
(58) Field of Classification Search ........... 438/584, 438/597, 669, 671; 977/762, 888, 890, 893; 257/E21.036, E21.038, E21.039
See application file for complete search history.

(56) References Cited

U.S. PATENT DOCUMENTS

| | | | |
|---|---|---|---|
| 4,242,374 A | 12/1980 | Sansregret | |
| 4,979,466 A | 12/1990 | Nishitani et al. | |
| 5,079,178 A | 1/1992 | Chouan et al. | |
| 5,140,391 A | 8/1992 | Hayashi et al. | |
| 5,168,077 A | 12/1992 | Ashizawa et al. | |
| 5,306,666 A | 4/1994 | Izumi | |
| 5,320,728 A | 6/1994 | Tepman et al. | |
| 6,099,655 A * | 8/2000 | Farr et al. ................ | 134/2 |
| 6,103,320 A | 8/2000 | Matsumoto et al. | |
| 6,137,107 A | 10/2000 | Hanson et al. | |
| 6,271,130 B1 | 8/2001 | Rajh et al. | |
| 6,274,014 B1 | 8/2001 | Matsumoto et al. | |
| 6,362,499 B1 | 3/2002 | Moise et al. | |

(Continued)

FOREIGN PATENT DOCUMENTS

JP      06053206 A   *  2/1994

(Continued)

OTHER PUBLICATIONS

Manago, T. and Akinaga, H. "Spin-Polarized Light-Emitting Diode Using Metal/Insulator/Semiconductor Structures." Appl. Phys. Lett., vol. 81, No. 4 (Jul. 22, 2002): pp. 694-696.*

(Continued)

*Primary Examiner*—Matthew W Such
(74) *Attorney, Agent, or Firm*—Schwegman, Lundberg & Woessner, P.A.

(57) ABSTRACT

The present invention relates to methods for fabricating nanoscale electrodes separated by a nanogap, wherein the gap size may be controlled with high precision using a self-aligning aluminum oxide mask, such that the gap width depends upon the thickness of the aluminum oxide mask. The invention also provides methods for using the nanoscale electrodes.

27 Claims, 9 Drawing Sheets

U.S. PATENT DOCUMENTS

Figure 1:
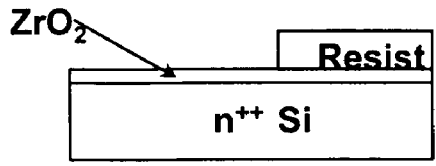
Figure 1:
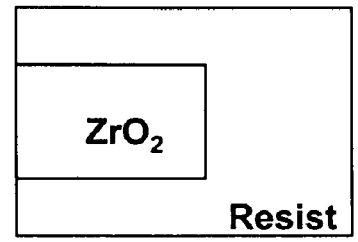
Figure 1:
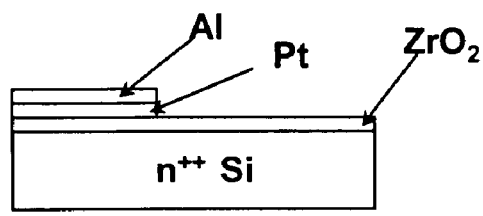
Figure 1:
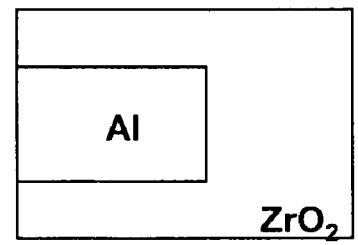
Figure 1:
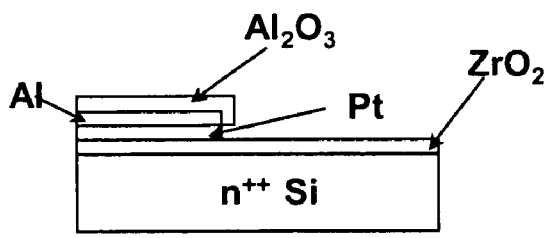
Figure 1:
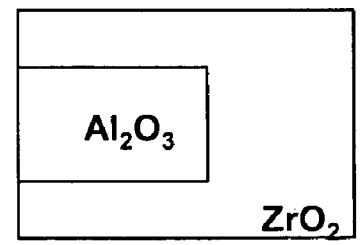
Figure 1:
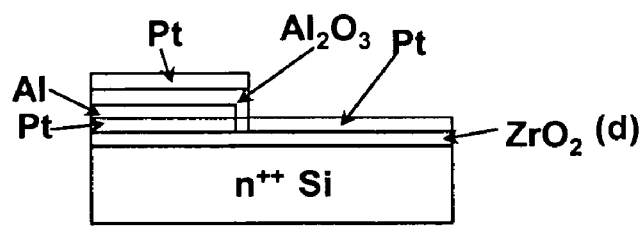
Figure 1:
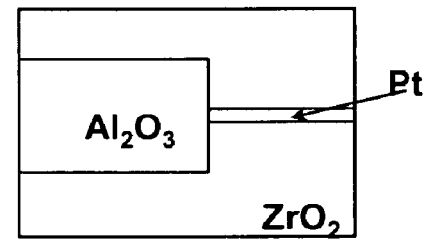
Figure 1:
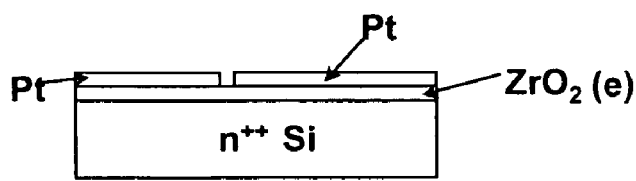
Figure 1:
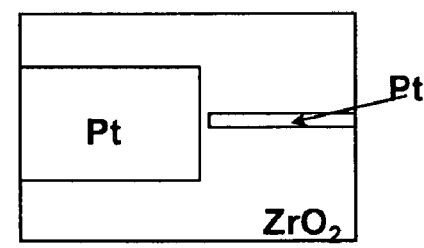

| | | | |
|---|---|---|---|
| 6,400,976 | B1 | 6/2002 | Champeau |
| 6,541,375 | B1 | 4/2003 | Hayashi et al. |
| 6,759,180 | B2 | 7/2004 | Lee |
| 6,881,604 | B2 | 4/2005 | Lindstrom et al. |
| 6,887,523 | B2 | 5/2005 | Zhuang et al. |
| 6,897,009 | B2 | 5/2005 | Johnson, Jr. et al. |
| 6,929,983 | B2 * | 8/2005 | Busta et al. ............ 438/142 |
| 2002/0106447 | A1 | 8/2002 | Lindstrom et al. |
| 2002/0168810 | A1 * | 11/2002 | Jackson ............ 438/172 |
| 2003/0021967 | A1 | 1/2003 | Sagiv et al. |
| 2003/0156359 | A1 | 8/2003 | Takahashi et al. |
| 2003/0185981 | A1 | 10/2003 | Min et al. |
| 2003/0230481 | A1 | 12/2003 | Miley |
| 2004/0000667 | A1 * | 1/2004 | Baniecki et al. ........ 257/66 |
| 2004/0127025 | A1 | 7/2004 | Crocker, Jr. et al. |
| 2004/0131843 | A1 | 7/2004 | Mirkin et al. |
| 2004/0175631 | A1 | 9/2004 | Crocker et al. |
| 2004/0227097 | A1 | 11/2004 | Brabec et al. |
| 2004/0248381 | A1 * | 12/2004 | Myrick ............ 438/460 |
| 2005/0057136 | A1 | 3/2005 | Moriya et al. |
| 2005/0112860 | A1 * | 5/2005 | Park et al. ............ 438/597 |
| 2005/0168113 | A1 | 8/2005 | Hirai et al. |
| 2005/0191434 | A1 | 9/2005 | Mirkin et al. |
| 2005/0202668 | A1 * | 9/2005 | McCarty ............ 438/623 |
| 2006/0008969 | A1 * | 1/2006 | Takahashi et al. ........ 438/216 |
| 2006/0154400 | A1 * | 7/2006 | Choi et al. ............ 438/49 |
| 2006/0278879 | A1 * | 12/2006 | Busta ............ 257/77 |
| 2008/0149479 | A1 * | 6/2008 | Olofsson et al. ........ 204/403.14 |

FOREIGN PATENT DOCUMENTS

KR        2003052665 A  *  6/2003

OTHER PUBLICATIONS

Machine Translation of JP06053206A.*

Machine Translation of KR2003052665A.*

Manago, T. and Akinaga, H. "Spin-Polarized Light-Emitting Diode Using Metal/Insulator/Semiconductor Structures." Appl. Phys. Lett., vol. 81, No. 4 (Jul. 22, 2002): pp. 694-696.*

"Insulating Materials", Techlib.com, [online]. [retrieved Sep. 9, 2005]. Retrieved from the Internet: <URL: http://techlib.com/reference/insulation.html>, (2005), 4 pgs.

"Semiconductors: Silicon: Metallization: Metal Deposition", *U.S. Department of Labor—OSHA*, [online], [retrieved Sep. 7, 2005]. Retrieved from the Internet: <URL: http://www.osha.gov/SLTC/semiconductors/metallization/metaldeposition.html>, (2005), 2 pgs.

Cho, Y.-K., et al., "Sub-Lithographic Patterning Technology for Nanowire Model Catalysts and DNA Label-Free Hybridization Detection", *Proceedings of SPIE*, vol. 5220—*Nanofabrication Technologies*, (2003), 10-19.

Cho, Y.-K., et al., "Sublithographic Nanofabrication Technology for Nanocatalysts and DNA Chips", *J. Vac. Sci. Technol. B* 21(6), (2003), 2951-2955.

Fursina, A., et al., "Nanogaps With Very Large Aspect Ratios for Electrical Measurements", *Applied Physics Letters*, 92, (2008), 113102-1-113102-3.

Lannoo, M., "1.9 Nanotechnology and Semiconducting Materials", *European White Book on Fundamental Research in Materials*, [online]. [archived May 16, 2006]. Retrieved from the Internet: <URL: http://web.archive.org/web/20060516021435/ http://www.mpg.de/pdf/europeanWhiteBook/wb_materials_063_066.pdf>, (2006), 4 pgs.

Martin, J. I., et al., "Ordered Magnetic Nanostructures: Fabrication and Properties", *Journal of Magnetism and Magnetic Materials*, 256 (2003), 449-501.

Tang, J., et al., "Chemically Responsive Molecular Transistors Fabricated by Self-Aligned Lithography and Chemical and Chemical Self-Assembly", *Journal of Vacuum Science & Technology B*, 24(6), (2006), 3227-3229.

Tang, J., et al., "Encoding Molecular-Wire Formation within Nanoscale Sockets", *Angew. Chem. Int. Ed.*, 46, (2007), 3892-3995.

Tang, J., et al., "Single-Molecule Transistor Fabrication by Self-Aligned Lithography and in situ Molecular Assembly", *Microelectronic Engineering*, 83, (2006), 1706-1709.

* cited by examiner

Side View | Top View (a)

(b)

(c)

(d)

(e)

(a)      (b)

METHODS FOR FABRICATING NANOSCALE ELECTRODES AND USES THEREOF

This application claims the benefit under 35 U.S.C. §119 (e) of U.S. Provisional Patent Application No. 60/691,197, filed Jun. 16, 2005; U.S. Provisional Patent Application No. 60/717,693, filed Sep. 16, 2005; and U.S. Provisional Patent Application No. 60/718,777, filed Sep. 20, 2005, each of which are hereby incorporated by reference herein in their entirety.

The invention disclosed herein was made with U.S. Government support from the National Science Foundation (CHE-0117752). Accordingly, the U.S. Government may have certain rights in this invention.

All patents, patent applications and publications cited herein are hereby incorporated by reference in their entirety. The disclosures of these publications in their entireties are hereby incorporated by reference into this application in order to more fully describe the state of the art as known to those skilled therein as of the date of the invention described and claimed herein.

This patent disclosure contains material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

1. FIELD OF THE INVENTION

The present invention relates to methods for fabricating nanoscale electrodes separated by a nanogap, wherein the gap size may be controlled with high precision using a self-aligning aluminum oxide mask, such that the gap width depends upon the thickness of the aluminum oxide mask. The invention also provides methods for using the nanoscale electrodes.

2. BACKGROUND OF THE INVENTION

Nanoelectronics is a developing field in which circuitry is composed of nanometer-sized electronic components. Researchers are compelled to explore the field because further miniaturization of small electronic circuits should result in the development of faster, more sophisticated, and more portable electronic devices.

Nanoscale electronics promises a new class of devices which can provide advantages in the form of high chip densities, three-dimensional architecture, and high-speed operation. The use of electrodeposited nanoscale electrodes as either quantum point contacts or metallic leads for a molecular junction may have potential applications in logic devices, both classical and quantum.

Essential to the realization of improved nanoscale based electronics is the fabrication of metallic electrodes separated by nanogaps. Electrodes with a separation of few nanometers also provide an effective, yet expensive, tool for studying electrical properties of single and multiple atoms. It has been reported that electroless or autocatalytic nickel plating is a useful technique to make such electrodes through metal deposition on substrate without an external source. One reported method provided two electrodes with a gap of 1-2 microns which were patterned using conventional lithography, immersed in an electroless nickel plating bath, then plated with nickel to narrow the gap. The drawbacks of this method include low yield and a low level of precision.

A primary goal of the field of molecular electronics is the realization of electronic switches comprising individual molecules as the key functional unit. These devices represent the ultimate limits of field-effect transistors scaling. The study of their electronic transport properties can provide a detailed understanding of electron dynamics at the nanoscale and will determine whether or not such devices are technologically feasible. Highly conjugated organic molecules synthesized for such studies are typically no more than a few nanometers in length, and the reliable fabrication of electrodes that can be bridged by a single molecule remains a significant challenge.

Thus, there still exists a need in the art for methods of making nanoscale electrodes having nanogap spacing with increased yields and precision. This invention addresses that need.

3. SUMMARY OF THE INVENTION

The present invention provides methods useful for fabricating nanoscale electrodes having nanogap spacing, the methods comprising patterning a first electrode onto a substrate, forming an aluminum oxide layer over the first electrode, then patterning a second electrode along the edge of the aluminum oxide mask. The aluminum oxide layer serves as a spacer between the first and second electrodes and removal of the aluminum oxide layer results in the formation of a nanogap between the first and second electrodes. Since the width of the aluminum oxide layer is highly controllable, the gap size may be determined with high precision and reproducibility. Accordingly, the present methods can provide nanoscale electrodes separated by uniform sized gaps of less than 10 nM in high yield and with control of the gap width with a precision on the order of 1 nm or less.

In one aspect, the invention provides a method for fabricating nanoscale electrodes separated by a nanogap, the method comprising:

(a) a first lithographic patterning step which defines a first electrode pattern on a substrate;

(b) depositing the first electrode onto the substrate as a metal film;

(c) depositing an aluminum film on top of the first electrode metal film;

(d) oxidizing the aluminum film such that an aluminum oxide layer forms on top of the aluminum film and extends laterally over the edge of the aluminum film such that the aluminum oxide layer forms an overhang over one or more edges of the aluminum film and the first electrode metal film;

(e) a second lithographic patterning step which defines a second electrode pattern on the substrate, wherein one edge of the second electrode pattern is parallel with one edge of the first electrode metal film;

(f) depositing the second electrode onto the substrate as a metal film such that one edge of the second electrode metal film is parallel with and in contact with the overhang of the aluminum oxide layer along one edge of the first electrode metal film; and (g) removing the aluminum oxide layer to form a gap between the first and second electrodes.

The present invention may be understood more fully by reference to the following detailed description and illustrative examples, which are intended to exemplify non-limiting embodiments of the invention.

In another aspect, the invention provides a method for fabricating nanoscale electrodes separated by a nanogap, the method comprising:

(a) a first lithographic patterning step which defines a first electrode pattern on a substrate;

(b) depositing the first electrode onto the substrate as a metal film;

(c) depositing a sacrificial spacer layer on top of the first electrode, wherein x is an integer ranging from 1 to 4;

(d) depositing an aluminum film on top of the sacrificial spacer layer;

(e) oxidizing the aluminum film such that an aluminum oxide layer forms on top of the aluminum film and extends laterally over the edge of the aluminum film such that the aluminum oxide layer forms an overhang over one or more edges of the aluminum film, the sacrificial spacer layer, and the first electrode metal film;

(f) a second lithographic patterning step which defines a second electrode pattern on the substrate, wherein one edge of the second electrode pattern is parallel with one edge of the first electrode metal film;

(g) depositing the second electrode onto the substrate as a metal film such that one edge of the second electrode metal film is parallel with and in contact with the overhang of the aluminum oxide layer along one edge of the first electrode metal film; and (h) removing the aluminum oxide layer and the sacrificial spacer layer to form a gap between the first and second electrodes.

4. BRIEF DESCRIPTION OF THE DRAWINGS

FIG. 1 shows schematic diagrams illustrating the fabrication of nanoscale electrodes which are separated by a nanogap. FIG. 1(a) illustrates a Si substrate having a $ZrO_2$ base layer and a resist on its surface; FIG. 1(b) shows a first platinum electrode patterned over the base layer and an aluminum film deposited on top of the first electrode; FIG. 1(c) shows an aluminum oxide layer that is formed on top of the aluminum film upon oxidation of the aluminum film; FIG. 1(d) shows the presence of a second platinum electrode that has been patterned on top of the substrate and the aluminum oxide layer, and FIG. 1(e) shows two platinum electrodes separated by a nanogap upon removal of the aluminum oxide layer.

Figure 2:
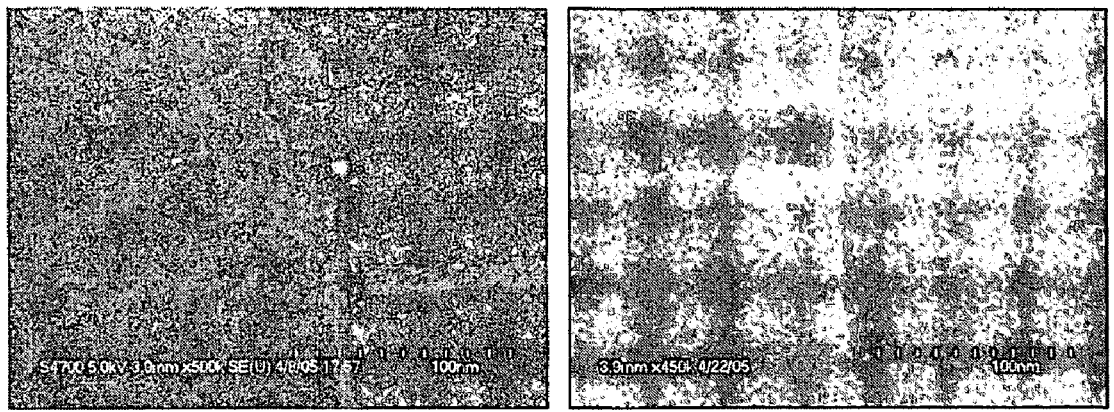

FIG. 2 shows scanning-electron microscope ("SEM") images of nanogaps between platinum electrodes that were patterned using the technique shown in FIG. 1. The electrodes were patterned on a substrate comprising a silicon wafer having a $ZrO_2$ base layer on its surface. FIG. 2(a) depicts a gap of 10 nm (corresponding to an aluminum film thickness of 30 nm) and FIG. 2(b) depicts a gap of 5 nm (corresponding to an aluminum film thickness of 8 nm).

Figure 3:
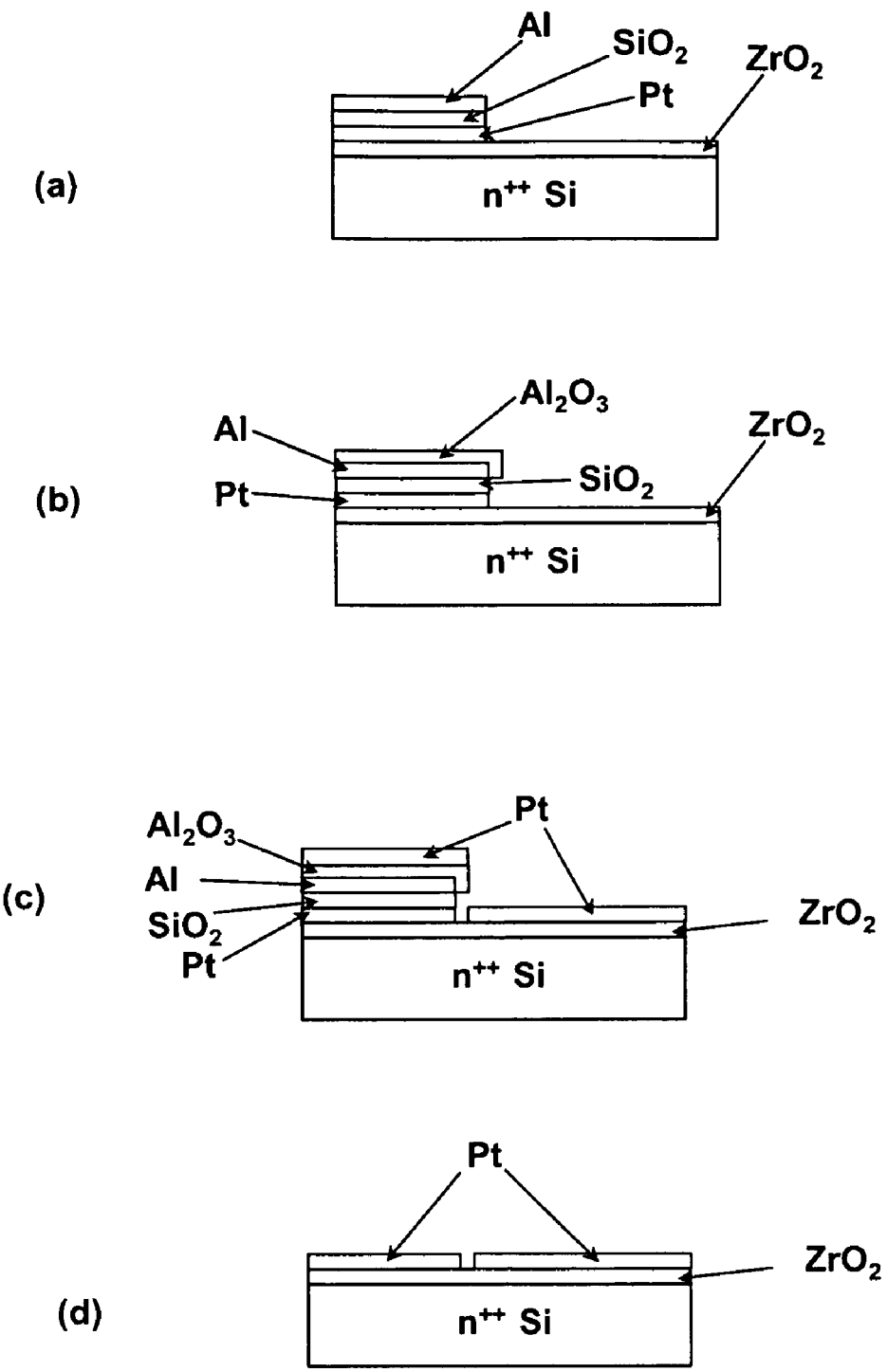

FIG. 3 shows schematic diagrams illustrating the fabrication of nanoscale electrodes using a $SiO_2$ sacrificial spacer layer. FIG. 1(a) illustrates a Si substrate having a $ZrO_2$ base layer, a first platinum electrode, a $SiO_2$ sacrificial spacer deposited over the first electrode, and an aluminum film deposited on top of the sacrificial spacer layer; FIG. 11(b) shows an aluminum oxide layer that is formed on top of the aluminum film upon oxidation of the aluminum film; FIG. 1(c) shows the presence of a second platinum electrode that has been patterned on top of the aluminum oxide layer, and FIG. 1(d) shows two platinum electrodes separated by a nanogap upon removal of the aluminum oxide layer and the sacrificial spacer layer.

Figure 4:
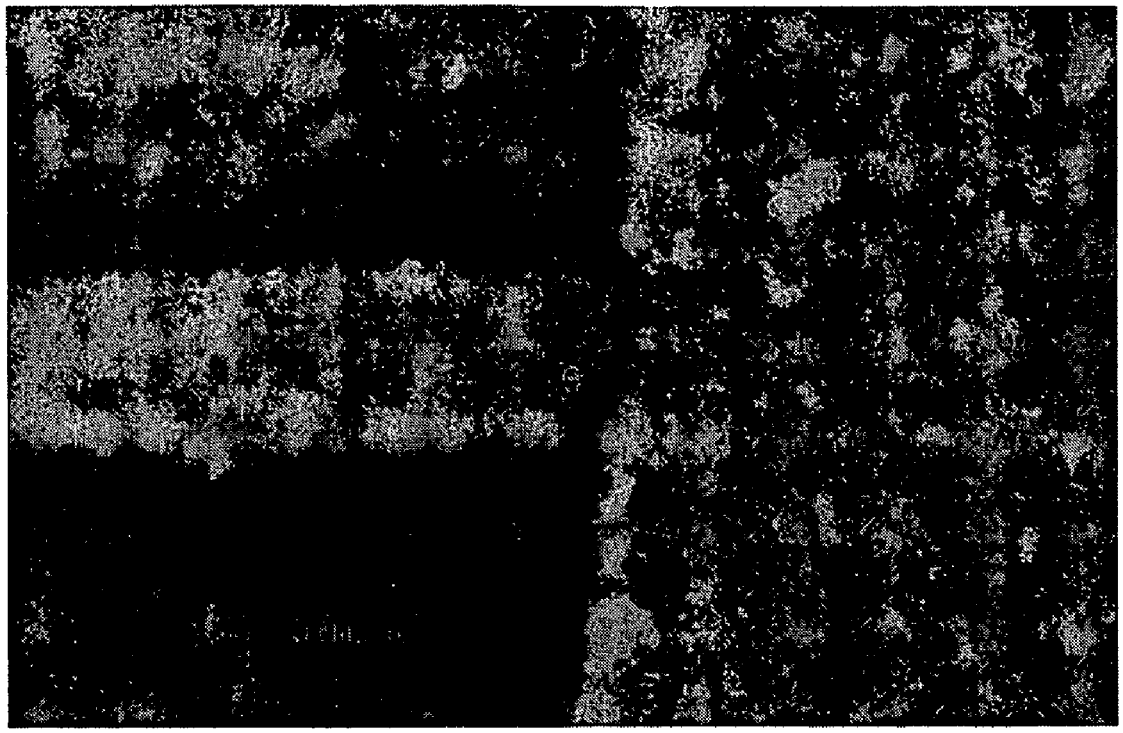

FIG. 4 shows a scanning-electron microscope ("SEM") image of a nanogap of about 3 nm that is vertically aligned between two platinum electrodes that were formed using the method described in FIG. 3.

Figure 5:
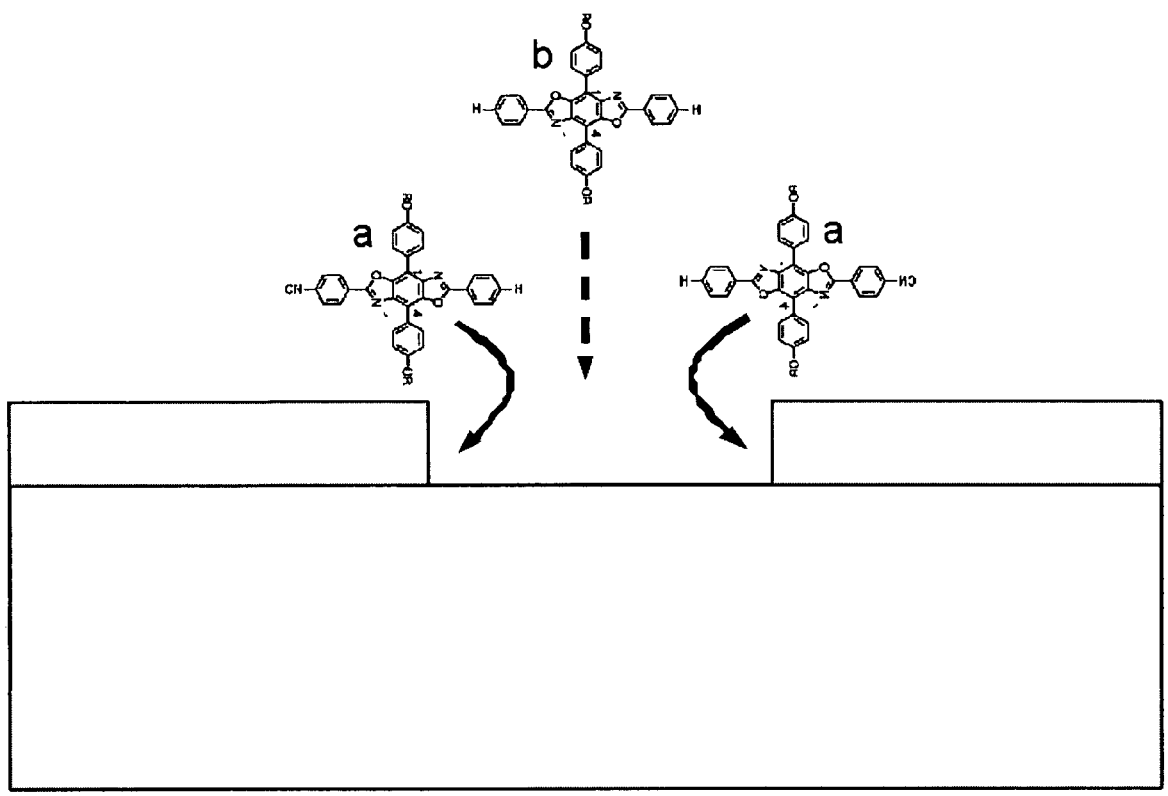

FIG. 5 illustrates the modular assembly of bis-benzoxazole molecules in a nanogap. Monothiol-terminated molecules (labeled a) are assembled onto platinum electrodes and then an amine-terminated molecule (labeled b) is inserted between the thiol-terminated molecules to bridge the gap. The substrate is heavily doped Si, which serves as the gate, with about 4 nm $ZrO_2$ as the gate dielectric.

Figure 6:
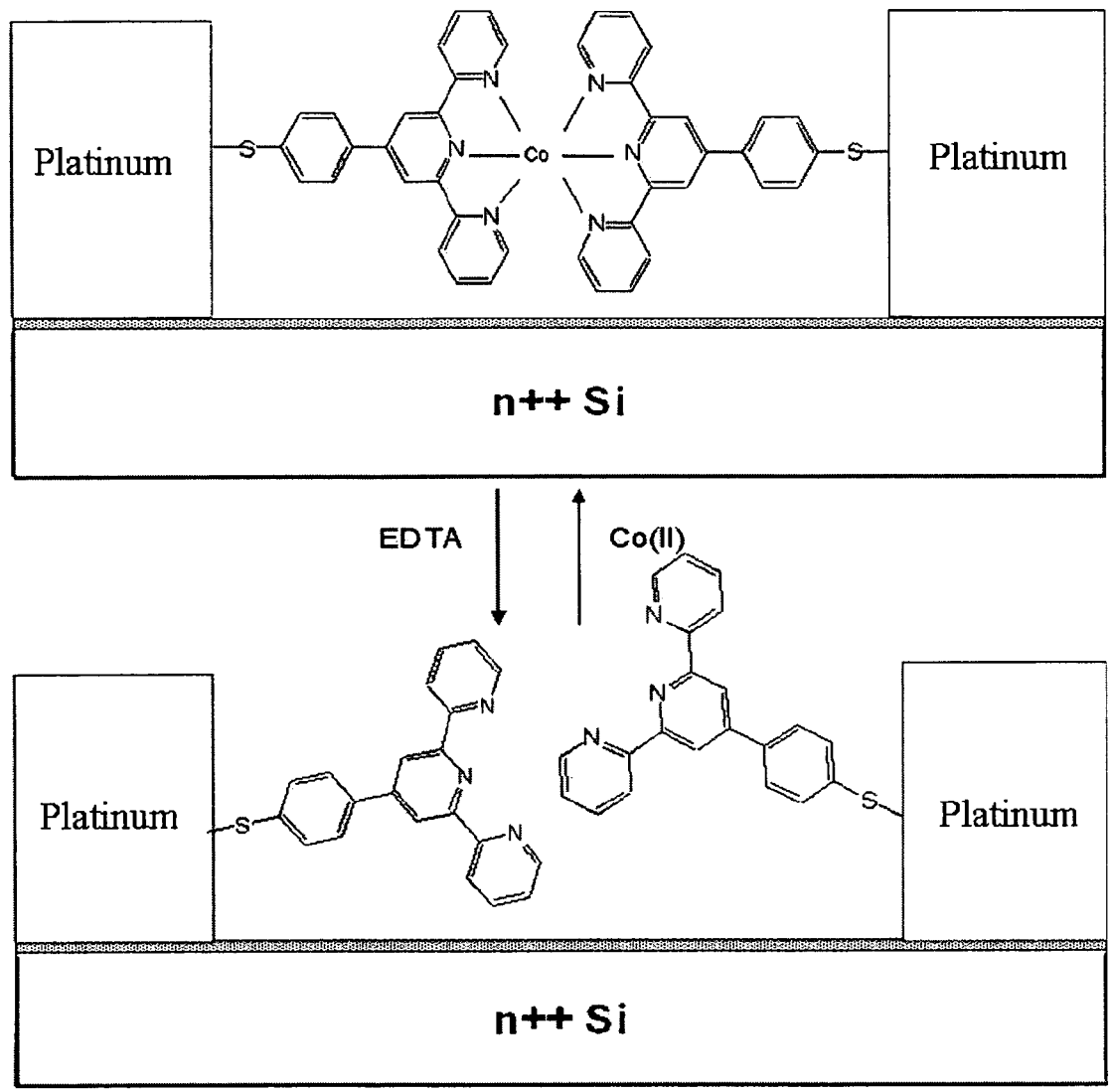

FIG. 6 illustrates a simple single-molecule transistor model comprising two thiolated ter-pyridine derivative (tpy-SH) bound to platinum electrodes. When mixed with $Co^{2+}$ solution, the tpy-SH molecules will combine with one $Co^{2+}$ atom to form a dimer of the formula $[Co(tpy-SH)_2]^{2+}$. The illustration shows how dimer can be decomposed by adding EDTA, which binds more strongly than $Co^{2+}$ to the tpy-SH molecule. This example demonstrates how a chemical reaction can be performed inside a prefabricated nanogap. The electrical response of the device monitors the chemical reaction of single or few molecules inside the nanogap.

Figure 7:
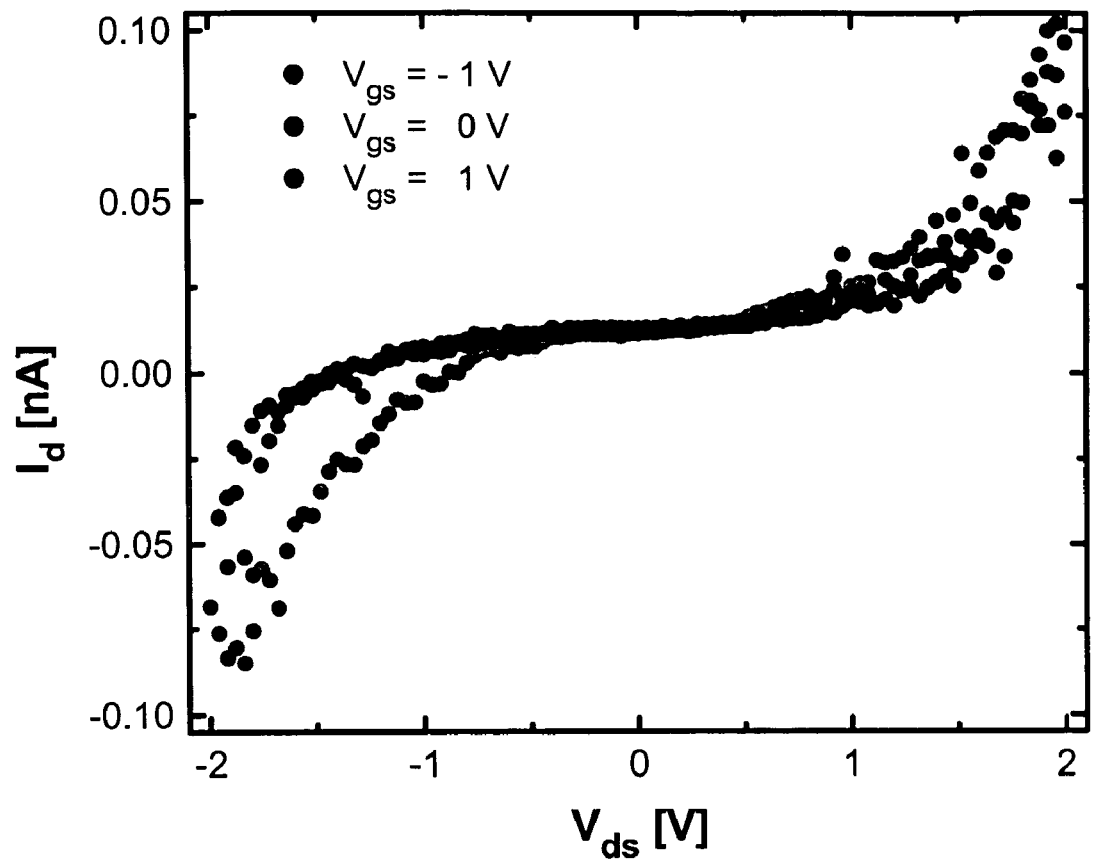

FIG. 7 shows the output characteristics of the device illustrated in FIG. 5 after assembly of the molecule. The output was measured at 3 different gate source voltages: −1V, 0 V and 1V. The interelectrode spacing is about 6-7 nm. The gate dielectric was 1 nm $SiO_2$ and 3.7 nm $ZrO_2$. The x-axis represents the drain current in nanoamperes and the y-axis represents the source drain voltage in volts. The current-voltage characteristics are indicative of electron transport through the molecule.

Figure 8:
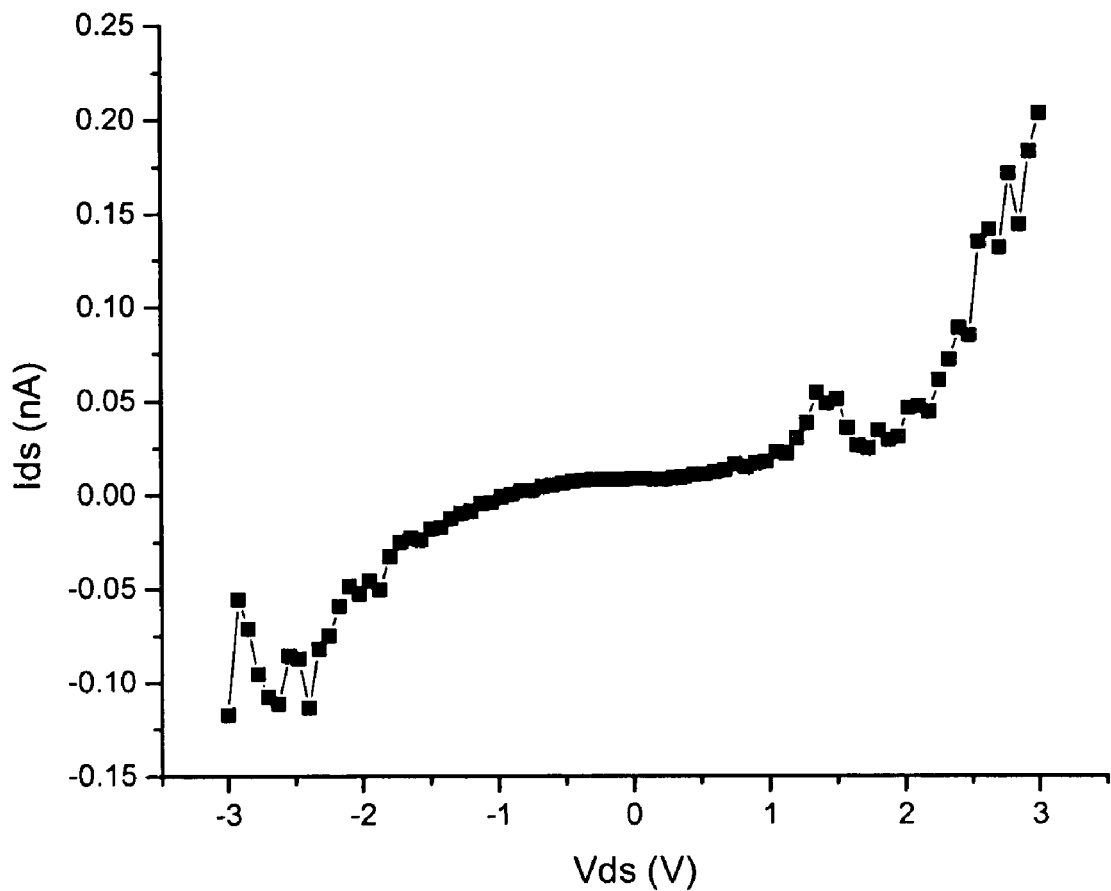

FIG. 8 is another diagram showing the output characteristics of the device of FIG. 6 prior to insertion of the tpy-SH molecule. This diagram indicates that the electrodes illustrated in FIG. 6 are separated by a gap of 2-3 nm. The x-axis represents the drain source current in nanoamperes and the y-axis represents the source drain voltage in volts. Clear signs of electron tunneling are visible at room temperature.

Figure 9:
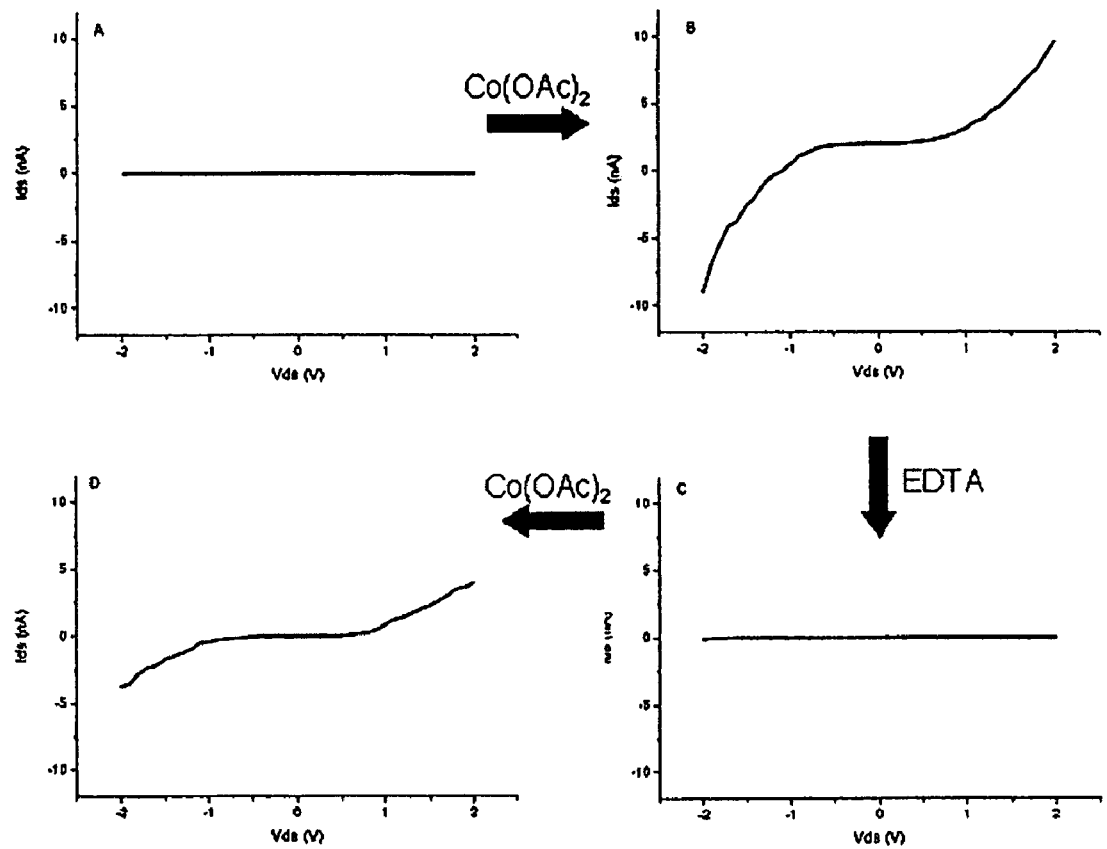

FIG. 9 shows output characteristics of the single-molecule transistor device illustrated in FIG. 6 in the presence and absence of a cobalt atom. FIG. 9A shows that there is no substantial current increase in the absence of a bridging cobalt atom between the thiolated ter-pyridine molecules. FIG. 9B shows that a substantial increase in current results when a cobalt atom bridges the thiolated ter-pyridine derivatives. FIG. 9C shows that the current is switched off upon removal of the cobalt atom using ethylenediaminetetraacetic acid (EDTA). FIG. 9D shows an increase in current when the cobalt atom is reintroduced into the device.

5. DETAILED DESCRIPTION OF THE INVENTION

The invention is directed to methods that allow the fabrication of nanometer-scale spacings between metal features in a self-aligned fashion, with very high precision and high yield.

5.1 Method for Fabricating Nanoscale Electrodes Having a Nanogap

In one aspect, the present invention provides a method for fabricating nanoscale electrodes, the method involving two critical patterning steps, one for each electrode. As part of the patterning of the first electrode, the electrode metal is deposited as a bilayer, with a thin sacrificial layer of aluminum deposited directly atop the electrode metal. Following liftoff, the aluminum is allowed to oxidize and increased stress due to the volumetric increase resulting from the oxidation is believed to cause enhanced lateral oxidation, causing a small overhang at the edge of the aluminum film, the extent of which is dependent upon the thickness of the aluminum film. A second lithographic step defines the second electrode, which runs across the edge of the first electrode, resulting in a gap between the two metal electrodes whose width is determined by the extent of the aluminum oxidation. The oxidized aluminum film is then removed using an acid or base, leaving the metal electrode films separated by the oxidation-defined gap. Since aluminum oxidation is self-limiting and the enhanced lateral oxidation is dependent upon the thickness of the original aluminum film, the gap size can be calibrated by the thickness of the aluminum film. The process is highly reproducible with process yields of 80% or more, wherein the yields are determined by dividing the number of gaps below 10 nm by the total number of gaps formed.

This method is self-aligned, requiring no extraordinary lithographic capabilities.

In one embodiment, the invention provides a method for fabricating nanoscale electrodes separated by a nanogap, the method comprising:

(a) a first lithographic patterning step which defines a first electrode pattern on a substrate;

(b) depositing the first electrode onto the substrate as a metal film;

(c) depositing an aluminum film on top of the first electrode metal film;

(d) oxidizing the aluminum film such that an aluminum oxide layer forms on top of the aluminum film and extends laterally over the edge of the aluminum film such that the aluminum oxide layer forms an overhang over one or more edges of the aluminum film and the first electrode metal film;

(e) a second lithographic patterning step which defines a second electrode pattern on the substrate, wherein one edge of the second electrode pattern is parallel with one edge of the first electrode metal film;

(f) depositing the second electrode onto the substrate as a metal film such that one edge of the second electrode metal film is parallel with and in contact with the overhang of the aluminum oxide layer along one edge of the first electrode metal film; and (g) removing the aluminum oxide layer to form a gap between the first and second electrodes.

In one embodiment, the gap formed between the first and second electrodes is from about 1 nm to about 10 nm.

In another embodiment, the gap is from about 3 nm to about 7 nm.

In still another embodiment, the gap is from about 1 nm to about 5 nm.

In another embodiment, the gap is from about 1 nm to about 2 nm.

In a further embodiment, the width of the gap is equal to the width of the overhang of the aluminum oxide layer over the edge of the first electrode metal layer.

5.2 The Electrodes

The nanoscale electrodes of the present invention are first patterned on a substrate using well-known lithographic techniques. Once patterned, the electrodes are deposited onto the substrate as a thin metal film. The first and second electrodes may consist of the same or different metals. In one embodiment, the electrodes may comprise any metal that is stable under acidic or basic conditions. Illustrative metals that are useful as nanoscale electrodes in the present invention include, but are not limited to copper, gold, platinum, nickel, germanium, silver, titanium, tungsten, tantalum, chromium, and ruthenium.

In one embodiment, the first and second electrodes consist of the same metal.

In still another embodiment, the first and second electrodes consist of different metals.

In one embodiment, the first and second electrodes are both platinum.

In another embodiment, one of the first and second electrodes is platinum and the other of the first and second electrodes is copper, gold or ruthenium.

The first and second electrodes, as well as the aluminum layer, may be deposited onto the substrate using any suitable method for metal deposition, including but not limited to, a vapor deposition technique, such as a physical vapor deposition technique, chemical vapor deposition, plasma-enhanced chemical vapor deposition, laser-assisted chemical vapor deposition, or physical vapor deposition; laser-assisted chemical liquid phase deposition; plasma spray deposition; atomic layer deposition; sputtering; electroless deposition; and vacuum deposition techniques such as electron-beam evaporation, filament evaporation, flash evaporation or induction evaporation.

Illustrative examples of other deposition techniques that may be used in the present methods include those described in, e.g., U.S. Pat. No. 6,887,523 to Zhuang et al., U.S. Pat. No. 6,274,014 to Matsumoto et al., U.S. Pat. No. 6,103,320 to Matsumoto et al., U.S. Pat. No. 5,320,728 to Tepman, U.S. Pat. No. 5,306,666 to Izumi, U.S. Pat. No. 5,168,037 to Ashizawa et al., U.S. Pat. No. 5,079,178 to Chouan et al., U.S. Pat. No. 4,979,466 to Nishitani et al., U.S. Pat. No. 4,242,374 to Sansregret, U.S. Patent Publication No. 2003185981 to Min et al., and Seshan, K. (Ed.) *Handbook of Thin-Film Deposition Processes and Techniques—Principles, Methods, Equipment and Applications* (2nd Edition) 2002; William Andrew Publishing/Noyes.

In one embodiment, the first and second electrodes are deposited onto the substrate using a vapor deposition technique.

In another embodiment, the first and second electrodes are deposited onto the substrate using a physical vapor deposition technique.

In a still another embodiment, the first and second electrodes are deposited onto the substrate using chemical vapor deposition.

In one embodiment, the first and second electrodes are of about the same thickness.

In another embodiment, the first and second electrodes are of different thickness.

In another embodiment, the second electrode is not significantly thicker than the first electrode.

5.3 Electrode Patterning

The two electrodes may be patterned using a suitable lithographic technique including, but not limited to, electron beam lithography, photolithography, ion beam lithography, x-ray lithography, extreme ultraviolet (EUV) lithography or soft lithography.

In one embodiment, the lithographic technique is electron beam lithography.

In another embodiment, the lithographic technique is photolithography.

In a further embodiment, the lithographic technique is soft lithography.

In another embodiment, the lithographic technique is ion beam lithography.

In another embodiment, the lithographic technique is EUV lithography.

In still another embodiment, the lithographic technique is x-ray lithography.

Illustrative examples of other lithographic techniques that may be used in the present methods include those described in, e.g., U.S. Pat. No. 6,271,130 to Rajh et al., U.S. Patent Publication No. 2005191434 to Mirkin et al., U.S. Pat. Publication No. 2004127025 to Vandom et al., U.S. Patent Publication No. 2004175631 to Crocker et al., U.S. Patent Publication No. 2004131843 to Mirkin et al., U.S. Patent Publication No. 2003021967 to Sagiv et al., and Giovannella et al., *Nanolithography: A Borderland Between Stm, Eb, Ib and X-Ray Lithographies* (Nato Science Series E, Applied Sciences) (Hardcover), NATO Advanced Research Workshop on Nanolithography.

The electrodes range in thickness from about 0.1 nm to about 10 nm. In one embodiment, the thickness of the electrodes is from about 1 nm to about 100 nm. In another embodiment, the thickness of the electrodes is from about 1 nm to about 100 nm. In still another embodiment, the thickness of the electrodes is from about 10 nm to about 50 nm. In various embodiments, the thickness of the electrodes is about 1 nm, about 5 nm, about 10 nm, about 15 nm, about 20 nm, about 25 nm, about 30 nm, about 40 nm, about 50 nm, about 60 nm, about 70 nm, about 80 nm, about 90 nm, and about 100 nm.

5.4 The Substrate

The substrate provides a support surface for the electrodes, and the electrodes are patterned then deposited on top of the substrate as a metal film. Suitable materials for the substrate include but are not limited to, alumina; a silicate; a nitride, such as GaN, InN, AlN or $Si_3N_4$; quartz; glass; plastic; a semiconducting material such as silicon, germanium, tin, GaAs, InP, SiC or ZnSe; an insulating material such as an acetate, a ceramic, an acrylic, beryllium oxide, fiberglass, a polyimide film, Teflon®, Lexan®, elamine, mica, Neoprene®, Nomex®, Kapton®, Merlon a polyolefin, a polyester, a polystyrene, a polyurethane, polyvinylchloride, or a thermoplastic; carbon; or a biological structure, such as DNA or a crystallized The substrate provides a support surface for the electrodes, and the electrodes are patterned then deposited on top of the substrate as a metal film. Suitable materials for the substrate include but are not limited to, alumina; a silicate; a nitride, such as GaN, InN, AlN or $Si_3N_4$; quartz; glass; plastic; a semiconducting material such as silicon, germanium, tin, GaAs, InP, SiC or ZnSe; an insulating material such as an acetate, a ceramic, an acrylic, beryllium oxide, fiberglass, a polyimide film, teflon, lexan, melamine, mica, neoprene, nomex, kapton, merlon, a polyolefin, a polyester, a polystyrene, a polyurethane, polyvinylchloride, or a thermoplastic; carbon; or a biological structure, such as DNA or a crystallized protein.

In one embodiment, the substrate has a substantially planar surface.

In one embodiment, the substrate is silicon.

In another embodiment, the substrate is a wafer.

In still another embodiment, the substrate is a silicon wafer.

In another embodiment, the substrate is a p-Type silicon wafer.

In one embodiment, the substrate has a base layer of a high gate dielectric material on its surface and the electrodes are patterned over the base layer. In another embodiment, the first electrode metal layer may have such a base layer deposited on top of it and the aluminum film is deposited on top of the base layer. In one embodiment, both the substrate and the first electrode metal layer have a base layer on their surface.

In one embodiment a base layer over either the substrate or the first electrode metal layer has a thickness of from about 0.2 nm to about 20 nm. In another embodiment, the thickness of the base layer is from about 1 nm to about 10 nm. In still another embodiment, the thickness of the base layer is from about 4 nm to about 7 nm. In a specific embodiment, the thickness of the base layer is about 5 nm.

Materials suitable for use as a base layer include, but are not limited to, a metal oxide, such as $ZrO_2$, $SiO_x$, $CeO_2$, $Ta_2O_5$, $TiO_2$, $Y_2O_3$, $SrTiO_3$, $ZrSnTiO$, $La_2O_3$ or $HfO_2$, wherein x is an integer ranging from 1 to 4; a nitride, such as a tantalum nitride, a silicon nitride or a silicon oxynitride; and lead zirconate titanate (PZT).

In one embodiment, the base layer comprises $ZrO_2$.

In another embodiment, the base layer comprises $ZrO_2$ and at least one of the first or second electrode comprises platinum.

In a specific embodiment, the substrate is a silicon wafer having a $SiO_2$ base layer (hereinafter referred to as "$SiO_2$/Si").

In another specific embodiment, the substrate is a silicon wafer having a $ZrO_2$ base layer (hereinafter referred to as "$ZrO_2$/Si").

In another specific embodiment, the substrate is a silicon wafer having a $ZrO_2$ base layer and at least one of the first or second electrode comprises platinum.

5.5 Sacrificial Spacer Layer

In one embodiment, the present methods for fabricating nanoscale electrodes having a nanogap can further comprise a sacrificial spacer layer which is deposited atop the first electrode and which lies between the first electrode and the aluminum layer.

Accordingly, when a sacrificial spacer layer is used, the present invention the invention provides a method for fabricating nanoscale electrodes separated by a nanogap, the method comprising:

(a) a first lithographic patterning step which defines a first electrode pattern on a substrate;

(b) depositing the first electrode onto the substrate as a metal film;

(c) depositing a sacrificial spacer layer on top of the first electrode, wherein x is an integer ranging from 1 to 4;

(d) depositing an aluminum film on top of the sacrificial spacer layer;

(e) oxidizing the aluminum film such that an aluminum oxide layer forms on top of the aluminum film and extends laterally over the edge of the aluminum film such that the aluminum oxide layer forms an overhang over one or more edges of the aluminum film, the $SiO_x$ layer, and the first electrode metal film;

(f) a second lithographic patterning step which defines a second electrode pattern on the substrate, wherein one edge of the second electrode pattern is parallel with one edge of the first electrode metal film;

(g) depositing the second electrode onto the substrate as a metal film such that one edge of the second electrode metal film is parallel with and in contact with the overhang of the aluminum oxide layer along one edge of the first electrode metal film; and (h) removing the aluminum oxide layer and the sacrificial spacer layer to form a gap between the first and second electrodes.

This method employs a trilayer over the substrate, wherein the trilayer consists of the first electrode layer deposited over the substrate, the sacrificial spacer layer deposited over the first electrode layer and the aluminum layer deposited over the sacrificial spacer layer.

The sacrificial spacer layer can comprise any group IV elemental oxide, including but not limited to $SiO_x$ and $TiO_x$, where x is an integer ranging from 1 to 4.

In one embodiment, the sacrificial spacer comprises $SiO_x$, where x is an integer ranging from 1 to 4.

In another embodiment, the sacrificial spacer comprises $TiO_x$, where x is an integer ranging from 1 to 4.

In a specific embodiment, the sacrificial spacer comprises $SiO_2$.

The sacrificial spacer layer can be deposited and patterned on the first electrode using any of the metal deposition techniques and lithographic techniques set forth above in sections 5.2 and 5.3, respectively.

In one embodiment, the sacrificial spacer layer has a thickness of from about 0.1 nm to about 200 nm.

In another embodiment, the sacrificial spacer layer has a thickness of from about 10 nm to about 100 nm thick.

In another embodiment, the sacrificial spacer layer has a thickness of from about 25 nm to about 75 nm thick.

In various embodiments, the sacrificial spacer layer has a thickness of about 1 nm, about 5 nm, about 10 nm, about 20 nm, about 30 nm, about 40 nm, about 50 nm, about 60 nm, about 70 nm, about 80 nm, about 90 nm, and about 100 nm.

The use of a sacrificial spacer layer in the present methods allows for the use of aluminum layers of decreased thickness, which results in the formation of electrodes separated by smaller gaps, such as gaps of 2 nm or less. In one embodiment, the nanoscale electrodes formed using a sacrificial spacer layer are separated by a gap of from about 1 nm to about 10 nm. In another embodiment, the nanoscale electrodes formed using a sacrificial spacer layer are separated by a gap of from about 1 nm to about 2 nm. In a further embodiment, the nanoscale electrodes formed using a sacrificial spacer layer are separated by a gap of from about 1 nm to about 5 nm. In various embodiments, the nanoscale electrodes formed using a sacrificial spacer layer are separated by a gap of about 1 nm, about 2 nm, about 3 nm, about 4 nm, about 5 nm, about 6 nm, about 7 nm, about 8 nm, about 9 nm, or about 10 nm.

5.6 Oxidation of the Aluminum film

The present methods for fabricating nanoscale electrodes comprise depositing an aluminum film on top of the first electrode and then oxidizing the aluminum film such that an aluminum oxide layer forms over the aluminum film in a lateral fashion and forms an overhang over one or more edges of the first electrode metal layer, as depicted for example, in FIG. 1(c).

The presence of a base layer between the first electrode metal layer and the aluminum film does not affect the ability of the oxidizing agent to oxidize the aluminum film.

The aluminum oxide layer acts as a lateral spacer between the first and second electrodes and the width of the aluminum oxide layer determines the width of the gap formed between the electrodes and the thickness of the aluminum oxide layer is determined by the thickness of the aluminum film that is being oxidized. Since it is possible to control the thickness of the aluminum layer to within a fraction of a nanometer, the gap between the electrodes may be formed with a high degree of precision.

The oxidation of the aluminum film in the present methods may occur via self-oxidation in air or alternatively, the aluminum film can be subject to a controlled oxidation using water vapor, low-pressure oxygen, or a plasma oxidation process, such as described, e.g., in U.S. Patent Publication No. 2005124174 to Ahn et al.

In one embodiment, the aluminum film air oxidizes to form the aluminum oxide layer.

In one embodiment, the aluminum film deposited on top of the first electrode has a thickness of from about 2 nm to about 50 nm.

In another embodiment, the aluminum film deposited on top of the first electrode has a thickness of from about 5 nm to about 30 nm thick.

In still another embodiment, the aluminum film deposited on top of the first electrode has a thickness of from about 10 nm to about 20 nm thick.

In yet another embodiment, the aluminum film deposited on top of the first electrode has a thickness of from about 2 nm to about 5 nm thick.

In a further embodiment, the aluminum film deposited on top of the first electrode has a thickness of less than 30 nm.

The thickness of the aluminum oxide layer can be determined using any suitable technique. In one embodiment, the thickness of the aluminum oxide layer is determined using a quartz crystalline microbalance.

5.7 Removal of the Aluminum Oxide Layer and the Sacrificial Spacer Layer

The aluminum oxide layer and the sacrificial spacer layer, when present, may be removed by contacting the respective layer with an acid or base solution. The acid or base may be gaseous, such as hydrochloric acid, or may be in liquid form. Alternatively, the acid or base may be in a solution. The solution may be aqueous or may comprise: (1) an acid or base; and (2) an organic solvent. In one embodiment, the solution comprises: (1) an acid or base; (2) an organic solvent; and (3) water.

In one embodiment, the aluminum oxide layer and/or the sacrificial spacer layer is removed using an acidic solution. In another embodiment, the acidic solution is an aqueous solution.

Acids useful in the present invention for removing the aluminum oxide layer and/or the sacrificial spacer layer include, but are not limited to, mineral acids, such as hydrochloric acid, hydrobromic acid, hydrofluoric acid, sulfuric acid, or nitric acid; and carboxylic acids, such as formic acid, acetic acid, trichloroacetic acid, or trifluoroacetic acid.

In one embodiment, the acid is a mineral acid.

In another embodiment, the acid is a carboxylic acid.

In a specific embodiment, the acid is hydrochloric acid.

In another specific embodiment, the acid is hydrofluoric acid.

In one embodiment, the acidic solution is an aqueous acid having a concentration of from about 0.05 M to about 5 M. In another embodiment, the aqueous acid has a concentration of from about 0.1 M to about 0.5 M. In yet another embodiment, the aqueous acid has a concentration of about 0.3 M. In various embodiments, the aqueous acid has a concentration of about 0.1 M, about 0.2 M, about 0.3 M, about 0.4M, about 0.5M, about 1.0 M, about 1.5 M, about 2.0 M, about 2.5 M, about 3.0 M, about 3.5 M, about 4.0 M, about 4.5 M, or about 5.0 M.

In one embodiment, the aluminum oxide layer and/or the sacrificial spacer layer is removed using a basic solution. In another embodiment, the basic solution is an aqueous solution.

Bases useful in the present invention for removing the aluminum oxide layer and/or the sacrificial spacer layer include, but are not limited to, alkali metal hydroxides, such as sodium hydroxide and potassium hydroxide; ammonium hydroxide; and tetramethyl ammonium hydroxide-2-propanol.

In one embodiment, the base is an alkali metal hydroxide.

In another embodiment, the base is tetramethyl ammonium hydroxide-2-propanol.

In one embodiment, the base is an aqueous base having a concentration of from about 0.05 M to about 5 M. In another embodiment, the aqueous base has a concentration of from about 0.1 M to about 0.5 M. In yet another embodiment, the aqueous base has a concentration of about 0.3 M. In various embodiments, the aqueous base has a concentration of about 0.1 M, about 0.2 M, about 0.3 M, about 0.4M, about 0.5M, about 1.0 M, about 1.5 M, about 2.0 M, about 2.5 M, about 3.0 M, about 3.5 M, about 4.0 M, about 4.5 M, or about 5.0 M.

In one embodiment, the base is aqueous tetramethyl ammonium hydroxide-2-propanol.

In another embodiment, the aqueous tetramethyl ammonium hydroxide-2-propanol has a concentration of from about 0.2 M to about 0.3 M.

The acid- or base-catalyzed removal process of the aluminum oxide layer and/or the sacrificial spacer layer in the present methods also results in the removal of the aluminum film and/or the sacrificial spacer layer, thus exposing the first electrode metal layer. When there is base layer between the first electrode metal layer and the aluminum film and a sacrificial spacer layer is absent, the acid- or base-catalyzed removal of the aluminum oxide layer results in the removal of the aluminum film as well as the base layer between the first electrode metal layer and the aluminum film and thus exposes the first electrode metal layer. When there is base layer between the first electrode metal layer and the aluminum film and a sacrificial spacer layer is present, the acid- or base-catalyzed removal of the sacrificial spacer layer results in the removal of the base layer between the first electrode metal layer and the sacrificial spacer layer and thus exposes the first electrode metal layer.

In one embodiment, when a sacrificial spacer layer is present, the aluminum oxide layer and the sacrificial spacer layer are simultaneously removed in one step.

In another embodiment, when a sacrificial spacer layer is present, the aluminum oxide layer and the sacrificial spacer layer are individually removed in two separate steps.

In one embodiment, a sacrificial spacer layer is removed using hydrofluoric acid.

5.8 Uses of the Nanoscale Electrodes

The in-situ molecular assembly made possible by the present methods allows for separate control over the three critical interfaces in the devices: metal/molecule; molecule/molecule; and molecule/dielectric.

The present invention provides nanoscale electrodes having nanogap spacing which may find use in numerous applications, including nanoelectronic devices; transistors, such as FinFET transistors and trigate transistors; molecular electronic devices within the context of the Nanoscale Science and Engineering Center (NSEC), such as single-molecule transistors; nanofabrication processes requiring a low-metal ion concentration; as quantum point contacts or metallic leads for a molecular junction; for the repair of damaged or malformed circuit interconnects in situ, which is currently not possible with standard lithographic techniques. In addition, the electrodes also have potential applications in both classic and quantum logic devices and the electrode structures may be useful as templates for other nanoelectronic structures, such as ultranarrow wires. The nanoscale electrodes are also useful as components of molecular sensors, chemical sensors and transducers.

The invention also provides for the use of the fabricated gaps, channels or spaces in biological studies. In one embodiment, a single molecule can be anchored within the nanoscale gap in order to achieve alignment of the molecules, or to achieve orientation (one end of the molecule attaches to one side wall, while the other end of the molecule attaches to the other side wall of the gap) of the molecules. The spacing formed by the fabrication method of this invention can be used in biological applications and processes such as filtration, molecular screening, chip analyses, diagnostics, for sorting DNA and as nanoscale ion channels.

In addition, the nanoscale electrodes formed using the present methods can have lithographic applications. In one embodiment, the nanogap formed between two nanoscale electrode structures can be used as an etch mask to transfer the pattern into underlying features.

In another aspect, the invention provides a method for conducting an in-situ chemical reaction inside a nanogap, which enables a chemical signal to be transduced as a change in electrical conductance of the molecule within the nanogap. By assembling a monolayer on metal electrode, the electrode surface is modified by the properties of the assembled molecule. This is achieved by functionalizing individual molecular units with appropriate endgroups, such that they will selectively attach one end to the metal electrode while leaving the other end to be recognized by molecules or ions from solution or from another electrode. By assembling the molecules in this way, a given device may be designed with specific chemical or electrical functionality. In addition, the length of the molecule may be modified by this in-situ assembly, relaxing the requirement that the molecule "fit" precisely in the interelectrode gap, thus making it easier to wire up conjugated molecules.

The nanoscale electrodes of the present invention can also be used as electronic switches comprising individual molecules as the key functional unit. These devices represent the ultimate limits of field-effect transistors scaling. The study of their electronic transport properties can provide a detailed understanding of electron dynamics at the nanoscale and will determine whether or not such devices are technologically feasible. Highly conjugated organic molecules synthesized for such studies are typically no more than a few nanometers in length, and the reliable fabrication of electrodes that can be bridged by a single molecule remains a significant challenge.

Other uses of the nanoscale electrodes include those described in, e.g., U.S. Pat. No. 6,881,604 to Lindstrom et al., U.S. Pat. No. 6,541,375 to Shinichiro et al., U.S. Pat. No. 6,400,976 to Kim, U.S. Pat. No. 6,400,976 to Champeau, U.S. Pat. No. 6,362,499 to Moise et al., U.S. Pat. No. 6,137,107 to Hanson et al., U.S. Pat. No. 5,140,391 to Hayashi et al., U.S. Patent Publication No. 2005057136 to Soichi et al., U.S. Patent Publication No. 2005168113 to Hirai et al., U.S. Patent Publication No. 2004227097 to Brabec et al., U.S. Patent Publication No. 2003230481 to Miley, U.S. Patent Publication No. 2003156359 to Takahashi et al., and U.S. Patent Publication No. 2002106447 to Lindstrom et al.

6. EXAMPLES

The use of a sacrificial aluminum mask for the purpose of self-aligned patterning can be applied in a variety of fabrication schemes. The process involves the lithographic patterning of nanoelectrodes in two separate steps, and involves depositing a film of aluminum metal on top of the first electrode, wherein the aluminum film serves as a shadow mask for the subsequent patterning of the second electrode.

The following example describes a method for the fabrication of a three-terminal nanoscale device useful for measuring electron transport through individual organic molecules.

6.1 Example 1

General Method for Fabrication of Nanoscale Electrodes Separated by a Nanogap

In this example, nanoscale electrodes were fabricated on heavily doped (n-type) Si substrates upon which a layer of $ZrO_2$ (4 to 7 nm thick) had been deposited using atomic layer deposition. The substrate serves as a gate electrode, and $ZrO_2$ serves as the gate dielectric. $ZrO_2$ provides an advantage over $SiO_2$, which was more typically used as a gate insulator for Si devices, as it has a significantly higher dielectric constant (about 20-25, versus about 4), thus providing enhanced coupling of the gate potential to the conducting channel even at greater thicknesses (the increased thickness relative to $SiO_2$ reduces electron tunneling through the gate dielectric, thereby reducing gate leakage current). $ZrO_2$ is advantageous as a gate dielectric when platinum was used as the electrode material, because platinum grows on $ZrO_2$ in two-dimensional sheets, leading to smooth platinum films that are conductive at nanoscale thicknesses.

The substrate was first coated with a layer of PMMA (polymethylmethacrylate) as a resist, with the layer of resist having a thickness ranging from about 25 nm to about 120 nm. Exposure of the first electrode pattern was carried out using an FEI Sirion scanning electron microscope equipped with a pattern generator and control system (J. C. Nabity, Inc.). The first electrode pattern, shown in FIG. 1(b), consists of a rectangle with dimensions of several nm on a side, although in general, the electrodes may be patterned in any shape. The rectangular shape in this particular example enables easy alignment of the second electrode pattern in a subsequent lithographic exposure.

Following exposure and PMMA development, a platinum film having a thickness of from about 4 nm was deposited on the patterned substrate using electron beam evaporation. A film of aluminum having a thickness of either 30 nm or 8 nm was then deposited in-situ over the platinum film immediately after the platinum deposition step (film thicknesses were measured using a quartz crystal microbalance film thickness monitor in the electron beam evaporation system). The sample was then removed from the electron beam evaporator and subjected to liftoff in a mixture of $CH_2Cl_2$ and acetone (9:1) at 75° C., resulting in the first electrode platinum film being present only in the patterned areas, as illustrated in FIG. 1b. The aluminum film was then allowed to self-oxidize in air, resulting in the vertical and lateral formation of an aluminum oxide layer over the aluminum film, wherein the aluminum oxide layer has a thickness of a few nm. (It may be possible to in-situ oxidize the aluminum film prior to removal of the sample from the electron beam evaporator. This may afford improved control over the thickness of the aluminum). Because of the thinness of the aluminum film, it has been somewhat difficult to determine the precise thickness of the oxide layer by standard ellipsometric and scanning electron microscope techniques, although efforts continue to further characterize these films via high resolution transmission electron microscopy (TEM).

The second electrode was then patterned using electron beam lithography in a process similar to that used to pattern the first electrode. The pattern of the second electrode was coarsely aligned to the first electrode pattern using alignment marks that were patterned on the sample prior to processing the first electrode. The second electrode pattern consists of rectangles similar to those in the first electrode pattern, although they may be narrower in one dimension in order to limit the number of molecules that will assemble between the electrodes. (In principle, both electrodes can be made as narrow as was lithographically feasible, i.e., several nm wide). In this particular example, the first electrode was made purposely wider than the second electrode in order to enable easy alignment of the second electrode. The second electrode width was chosen to be about 20 nm, as it was difficult to realize much smaller features using the current electron beam lithography system.) The second electrode pattern runs across the first electrode as illustrated in FIG. 1(d), and the electron channel of the transistor will be formed at the intersection of the two electrodes.

Following exposure and development of the second electrode pattern, a second metal film was deposited on top of the substrate using electron beam evaporation. The thickness of the second electrode is critical. The second electrode cannot be substantially thicker than the first electrode or it may form on the sidewall of the aluminum film, and thus make it difficult to remove the second electrode metal when the aluminum film is stripped. In this particular example, both the first the second electrodes were platinum After deposition of the second electrode metal, the sample was subjected to another liftoff step similar to that used for the first electrode patterning. This resulted in the formation of a narrow strip of metal running across the first electrode, as illustrated in FIG. 1(d).

The sample was then immersed in aqueous tetramethylammoniumhydroxide (TMAH) etchant solution, then rinsed with water. This step removed the aluminum film, the aluminum oxide that was formed over the aluminum film, and the second electrode metal film that was patterned on top of the aluminum oxide layer, to provide a first and second electrode separated by a nanoscale gap, as shown in FIG. 1(e). As the aluminum oxide layer forms on the aluminum film, it grows both vertically and laterally and the extent of the lateral oxidation appears to be a function of the thickness of the deposited aluminum film. Although this oxide was known to be self-terminating (i.e., for thick aluminum films, the oxide thickness does not grow arbitrarily thick), there was a dependence of the extent of lateral oxidation, at least for nm-thick films. Such an effect has been observed in the lateral oxidation of AlGaAs at heterostructure interfaces. In the present methods, this thickness dependence of the lateral oxidation allows for the "tuning" of the interelectrode gap by controlling the thickness of the aluminum and its oxidation.

Scanning electron microscopy (SEM) analysis confirmed that a nanogap was formed between the two electrodes and the width of this gap was a function of the thickness of the deposited aluminum film. As shown in FIG. 2, the 30 nm aluminum film resulted in the formation of a 10 nm gap and the 8 nm aluminum film resulted in the formation of a 5 nm gap. The yield of this process was about 80%.

6.2 Example 2

Use of a Sacrificial $SiO_x$ Layer in a General Method for Fabrication of Nanoscale Electrodes Separated by a Nanogap Samples are fabricated on heavily doped (n-type) silicon substrates upon which a thin layer (about 4 nm to about 7 nm thick) of $ZrO_2$ has been deposited by atomic layer deposition.

The substrate serves as a gate electrode, and the $ZrO_2$ is the gate dielectric. Because of the high dielectric constant of $ZrO_2$ (about 20-24), thicker films may be used relative to $SiO_2$, while achieving the same effective gate field coupling. $ZrO_2$ provides an additional advantage when Pt is used as the electrode material, in that Pt grows on $ZrO_2$ in two-dimensional sheets, leading to extremely smooth Pt films which are conductive even at thicknesses of only a few nm.

The first step in the nanoelectrode formation process is the lithographic patterning of the first electrode. In the present work, this is done by electron beam lithography, although virtually any lithographic method may be used. A sample is coated with a layer of PMMA (poly-methylmethacrylate), to a thickness ranging from about 25 nm to about 120 nm, depending on the thickness of the metal to be deposited. Exposure of the first electrode pattern is done in an FEI Sirion scanning electron microscope equipped with a pattern generator and control system from J. C. Nabity, Inc. The first electrode pattern typically consists of an array of rectangles with dimensions about 1 micron or less on a side. This enables easy alignment of the second electrode pattern in a subsequent lithographic exposure.

Following exposure and PMMA development, the first electrode pattern is deposited as a trilayer consisting of the electrode metal (Pt), followed by sacrificial layers of $SiO_x$ and Al, wherein x is an integer ranging from 1 to 4. All three layers are deposited in-situ by electron beam evaporation without breaking vacuum. The $SiO_x$ and Al film thicknesses are typically from about 2 nm to about 5 nm, as determined by a quartz crystal microbalance. After removal from the electron beam evaporator, the sample undergoes liftoff in a mixture of $CH_2Cl_2$ and acetone (9:1) at 75° C. The first electrode pattern covered by the sacrificial layer is shown schematically in FIG. 3(a). Al oxidizes easily in air and is known to form a robust native oxide layer with thickness of a few nm (FIG. 3(b)), resulting in an overhang structure on top of the first electrode while the $SiO_x$ and Al form an ideal bilayer profile for a subsequent lift-off process. (It may be possible to oxidize the Al film in-situ prior to removal of the sample from the electron beam evaporator. This may afford improved control over the thickness of the aluminum oxide.) Because of the thinness of the Al oxide layer, it has been somewhat difficult to determine the precise thickness of the oxide layer by standard ellipsometric and scanning electron microscope techniques, although efforts continue to further characterize these films via high resolution transmission electron microscopy (HR-TEM).

The second electrode is patterned by electron beam lithography using a process similar to the first electrode patterning. The pattern is coarsely aligned to the first electrode using prepatterned alignment marks. The second electrode pattern consists of rectangles similar to those in the first electrode pattern, although they may be narrower in one dimension, in order to limit the number of molecules that will assemble between the electrodes. (In this work, the second electrode width is chosen to be about 20 nm.) The narrow second electrode pattern runs across the first electrode, as in FIG. 3(c). The electron channel of the transistor will be formed at the intersection of the two rectangles.

Following exposure and development of the second electrode pattern, a second metal film is deposited by electron beam evaporation. The metal may be the same as the first electrode material, or it may be different. For this work, we have chosen to form the second electrode from Pt. The thickness of the second electrode is critical. It cannot be substantially thicker than the first electrode, as it will tend to form on the sidewall of the Al film, making it difficult to remove when the Al and $SiO_x$ are stripped. After the second electrode metal deposition, the sample undergoes another liftoff step similar to that used for the first electrode patterning. This leaves a narrow strip of metal running across the first electrode.

At this point in the process, the Al and $SiO_x$ sacrificial layers are removed by immersion in an etchant solution. In the case of Pt on $ZrO_2$, the sacrificial layers are removed in an aqueous solution of TMAH (tetramethylammoniumhydroxide), followed by a $H_2O$ rinse. This step removes the Al, $Al_2O_3$, $SiO_x$ and the second layer of metal which was patterned on top of the first electrode, as shown in FIG. 3(d). The yield of this process in terms of the number of devices on a sample with nanometer-spaced electrodes as a function of devices patterned is extremely high, about 80%. A scanning electron micrograph of a device with interelectrode spacing of about 3 nm is shown in FIG. 8.

6.3 Example 3

Single-Molecule Transistor Fabrication by Self-Aligned Lithography and in-situ Molecular Assembly For the fabrication of molecular devices, molecules of bis-benzoxazole are assembled in a modular fashion within the interelectrode gaps, as shown in FIG. 5. First, monothiol-terminated molecules are assembled onto platinum electrodes to form good metal/molecule junctions. A second assembly step then inserts an amine-terminated molecule to bridge the gap. The substrate is heavily doped Si, which serves as the gate, with about 4 nm $ZrO_2$ as the gate dielectric. FIG. 7 shows an example of the electrical characteristics of these devices after assembly of the molecule. The interelectrode spacing is about 4 nm. Clear signs of electron tunneling are visible at room temperature (no measurable current is detected prior to the assembly of the molecule).

Molecular Assembly and Electrical Measurement

The molecule used in this example is the thiolated ter-pyridine derivative (tpy-SH) shown in FIG. 6. When mixed with $Co^{2+}$ solution, two tpy-SH molecules will combine with one $Co^{2+}$ atom to form a dimer of the formula Co(tpy-SH)$_2$]$^{2+}$, and this complex can be decomposed by adding EDTA, which binds more strongly than $Co^{2+}$ to the tpy-SH molecule. In this example, this chemical reaction is performed inside a prefabricated nanogap, while the tpy-SH molecules are immobilized on platinum electrodes. The electrical response of the device monitors the chemical reaction of single or few molecules inside the nanogap.

The prefabricated platinum nanogaps are electrically tested prior to and after the tpy-SH assembly in order to ensure that no conductive channel is formed upon the initial tpy-SH. Initial room temperature measurements on bare electrodes (i.e., without the presence of any molecule) detect a tunneling current in about 15% of the devices, this being indicative that the interelectrode spacing for these devices is about 2 nm or less. The devices are then tested after the assembly of the tpy-SH. Currents of the devices on this step are recorded to compare with following steps. Most devices show no substantial current increase, as indicated in FIG. 9(a), while a small fraction show some unstable increasing current; this may due to the tunneling between molecules. When the devices are then placed into a solution of Co(OAc)$_2$ in $H_2O$, removed, rinsed, and again measured 25 out of 110 devices show an increase in current of about 3 orders of magnitude (FIG. 9(b)). This indicates the connection of two ter-pyridyl arms via a $Co^{2+}$ connection. Further evidence for the cobalt ions being responsible for the conduction comes from the experimental data shown in FIG. 9(c), where the cobalt is removed with EDTA and reinserted with $Co(OAc)_2$. The current is switched between ON and OFF respectively. This completely reversible behavior offers a potential path for future nanoscale chemical sensors and transducers based on simple chemical reactions.

Various modifications of the invention in addition to those shown and described herein will become apparent to those skilled in the art and are intended to fall within the scope of the appended claims. The disclosure of all patents and patent publications herein is hereby incorporated by reference.

What is claimed is:

1. A method for fabricating nanoscale electrodes separated by a nanogap, the method comprising:
    (a) a first lithographic patterning step which defines a first electrode pattern on a substrate;
    (b) depositing a first electrode onto the substrate as a first electrode metal film, the first electrode deposited on and contacting a first layer of material;
    (c) depositing a second metal film on top of the first electrode metal film;
    (d) oxidizing the second metal film such that a metal oxide layer forms on top of the second metal film and extends laterally, due to the oxidizing, over the edge of the second metal film such that the metal oxide layer forms an overhang over one or more edges of the second metal film and the first electrode metal film, the overhang having a bottom surface, the overhang laterally adjacent the first and second metal films such that a space is formed between the bottom surface of the overhang and the first layer;
    (e) a second lithographic patterning step which defines a second electrode pattern on the substrate;
    (f) depositing a second electrode onto the substrate as a metal film, the second electrode deposited on and contacting the first layer of material, the second electrode deposited after forming the overhang; and
    (g) removing the metal oxide layer to form a gap between the first and second electrodes.

2. The method of claim 1, wherein the first and second electrodes comprise the same metal.

3. The method of claim 2, wherein the metal comprises platinum.

4. The method of claim 1, wherein the first and second electrodes comprise different metals.

5. The method of claim 4, wherein one of the different metals comprises platinum and the other comprises copper, gold or ruthenium.

6. The method of claim 1, wherein a width of the gap formed is from about 0.1 nm to about 10 nm.

7. The method of claim 6, wherein the width of the gap is from about 3 nm to about 7 nm.

8. The method of claim 6, wherein the width of the gap is from about 1 nm to about 5 nm.

9. The method of claim 1, wherein the width of the gap formed is equal to the width of the overhang of the metal oxide layer over the edge of the first electrode metal layer.

10. The method of claim 1, wherein the metal oxide layer comprises aluminum oxide and the removing comprises contacting the aluminum oxide layer with a basic solution.

11. The method of claim 10, wherein the basic solution comprises aqueous tetramethyl ammonium hydroxide-2-propanol.

12. The method of claim 1, wherein the substrate comprises silicon.

13. The method of claim 12, wherein the substrate comprises a wafer.

14. The method of claim 1, wherein the substrate comprises a high gate dielectric base layer on a substrate surface.

15. The method of claim 14, wherein the base layer comprises $SiO_2$.

16. The method of claim 14, wherein the base layer comprises $ZrO_2$.

17. The method of claim 1, wherein the first and second electrodes are deposited on top of the substrate using chemical vapor deposition.

18. The method of claim 1, wherein the second metal film has a thickness of from about 5 nm to about 30 nm thick.

19. The method of claim 1, wherein the first and second lithographic patterning steps are carried out using electron-beam lithography.

20. A method for fabricating nanoscale electrodes separated by a nanogap, the method comprising:
    (a) a first lithographic patterning step which defines a first electrode pattern on a substrate;
    (b) depositing the first electrode onto the substrate as a first electrode metal film, the first electrode deposited on and contacting a first layer of material;
    (c) depositing a sacrificial spacer layer on top of the first electrode;
    (d) depositing a second metal film on top of the sacrificial spacer layer;
    (e) oxidizing the second metal film such that a metal oxide layer forms on top of the second metal film and extends laterally, due to the oxidizing, over the edge of the second metal film such that the metal oxide layer forms an overhang over one or more edges of the second metal film, the sacrificial spacer layer, and the first electrode metal film, the overhang having a bottom surface, the overhang laterally adjacent the first electrode metal film, the sacrificial spacer layer and second metal film such that a space is formed between the bottom surface of the overhang and the first layer;
    (f) a second lithographic patterning step which defines a second electrode pattern on the substrate;
    (g) depositing the second electrode onto the substrate as a metal film, including the second electrode deposited on and contacting the first layer of material, the second electrode deposited after forming the overhang; and
    (h) removing the metal oxide layer and the sacrificial spacer layer to form a gap between the first and second electrodes.

21. The method of claim 20, wherein the sacrificial spacer layer comprises $SiO_x$, where x is an integer ranging from 1 to 4.

22. The method of claim 20, wherein the sacrificial spacer layer comprises $TiO_x$, where x is an integer ranging from 1 to 4.

23. The method of claim 21, wherein the sacrificial spacer layer comprises $SiO_2$.

24. The method of claim 1, wherein one edge of the second electrode pattern is parallel with one edge of the first electrode metal film and comprising depositing the second electrode onto the substrate as a metal film such that one edge of the second electrode metal film is parallel with and in contact with the overhang of the metal oxide layer along one edge of the first electrode metal film.

25. The method of claim 20, wherein one edge of the second electrode pattern is parallel with one edge of the first electrode metal film and comprising depositing the second electrode onto the substrate as a metal film such that one edge of the second electrode metal film is parallel with and in contact with the overhang of the metal oxide layer along one edge of the first electrode metal film.

26. The method of claim 1, wherein the second metal film comprises aluminum.

27. The method of claim 20, wherein the second metal film comprises aluminum.

* * * * *